(12) United States Patent
Wu et al.

(10) Patent No.: US 9,537,576 B2
(45) Date of Patent: Jan. 3, 2017

(54) ENCODING AND DECODING METHODS FOR HIGH-PRECISION TIME TRANSFER AND ENCODING AND DECODING DEVICES THEREFOR

(71) Applicant: Shanghai Jiao Tong University, Shanghai (CN)

(72) Inventors: Guiling Wu, Shanghai (CN); Liang Hu, Shanghai (CN); Jianguo Shen, Shanghai (CN); Weiwen Zou, Shanghai (CN); Jianping Chen, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 32 days.

(21) Appl. No.: 14/562,000

(22) Filed: Dec. 5, 2014

(65) Prior Publication Data

US 2015/0093122 A1 Apr. 2, 2015

Related U.S. Application Data

(63) Continuation of application No. PCT/CN2014/000549, filed on Jun. 3, 2014.

(30) Foreign Application Priority Data

Aug. 7, 2013 (CN) .......................... 2013 1 0342084

(51) Int. Cl.
*H03K 7/08* (2006.01)
*H03K 9/08* (2006.01)
(Continued)

(52) U.S. Cl.
CPC ............. *H04B 10/524* (2013.01); *G01S 19/00* (2013.01); *H03M 5/14* (2013.01); *H04L 1/00* (2013.01); *H04L 25/00* (2013.01); *H04L 25/4902* (2013.01)

(58) Field of Classification Search
CPC ..................... H04B 2001/6908; H04B 1/7176; H04B 1/69; H04B 1/719; H04B 14/026; H04B 14/02; H04L 25/4902; H03K 7/08; H03K 7/04; H03K 9/04; H03F 3/217; H03F 2200/351; G06F 1/025
(Continued)

(56) References Cited

U.S. PATENT DOCUMENTS 3,876,840 A * 4/1975 Bryant, Jr. .......... H04M 3/4876
360/12
4,117,661 A * 10/1978 Bryant, Jr. ............. G04G 7/026
368/47
(Continued)

FOREIGN PATENT DOCUMENTS

CN 201369712 Y 12/2009
CN 202998116 U 6/2013

OTHER PUBLICATIONS

"IRIG Serial Time Code Formats"—IRIG Standard 200-04; Published 2004. >>http://irigb.com/pdf/wp-irig-200-04.pdf<<.*
(Continued)

Primary Examiner — James M Perez
(74) Attorney, Agent, or Firm — Mei & Mark LLP; Manni Li

(57) ABSTRACT

A format for modified IRIB-G time code, with added message fields while preserving pulse width coding rule of the standard IRIG-B time code, having a time interval field for carrying time interval between the local time signal and a received time signal, and a user-defined or padded field for carrying user-defined time and/or control messages. An encoding and a decoding methods and devices for high-precision time transfer, where the modified IRIG-B time code carries more messages, and enabling transmission of timing messages and testing messages of two-way time comparison via a single message channel at the same time,
(Continued)

which reduces fluctuation due to encoding and decoding manipulation and correlation with working frequencies via exact synchronization between the on-times of the output encoded time code and the transmitted time signal, and between the on-times of the output decoded time signal and the input time code, and improves precision of time transfer.

5 Claims, 5 Drawing Sheets

(51) Int. Cl.
*H04B 10/524* (2013.01)
*H03M 5/14* (2006.01)
*H04L 25/49* (2006.01)
*G01S 19/00* (2010.01)
*H04L 1/00* (2006.01)
*H04L 25/00* (2006.01)

(58) Field of Classification Search
USPC .............................. 375/130–153, 211–215, 237–239, 375/353–376
See application file for complete search history.

(56) References Cited

U.S. PATENT DOCUMENTS

| 5,680,324 | A | * | 10/1997 | Schweitzer, III | H02H 3/00 340/870.02 |
| 5,793,869 | A | * | 8/1998 | Claflin, Jr. | H04L 9/06 380/269 |
| 5,905,758 | A | * | 5/1999 | Schweiter, III | H04B 10/40 370/546 |
| 7,398,411 | B2 | * | 7/2008 | Zweigle | H03L 7/08 342/357.52 |
| 9,124,357 | B2 | * | 9/2015 | Jia | H04B 1/71632 |
| 9,191,080 | B2 | * | 11/2015 | Yokomakura | H04B 7/0413 |
| 2005/0041767 | A1 | * | 2/2005 | Whitehead | H03L 7/08 375/376 |
| 2006/0259806 | A1 | * | 11/2006 | Zweigle | H03L 7/08 713/400 |
| 2007/0258507 | A1 | * | 11/2007 | Lee | H04B 1/71632 375/138 |
| 2011/0185214 | A1 | * | 7/2011 | Luskind | G06F 1/12 713/375 |
| 2014/0025321 | A1 | * | 1/2014 | Spanier | G01R 21/133 702/62 |
| 2016/0072602 | A1 | * | 3/2016 | Earl | H04L 12/10 709/248 |

OTHER PUBLICATIONS

Wang, Subei et al., "Design and verification of a time code for fiber-optic two-way time transfer," Optical Communication Technology, vol. 1, 2013, Jan. 15, 2013, Chapter I and Figure 2.
Wang, Subei, "Design and Implementation of the Time Code for High-Precision Fiber-Optic Time Transfer," Chinese Master Thesis Database, No. 7, pp. 29-41, Jul. 2013.
Bing, Zhi-guang et al., "Application of IRIG-B code in time synchronization system," Modern Electronics Technique, vol. 35, No. 7 (Apr. 1, 2012).

* cited by examiner

ENCODING AND DECODING METHODS FOR HIGH-PRECISION TIME TRANSFER AND ENCODING AND DECODING DEVICES THEREFOR

CROSS-REFERENCE AND RELATED APPLICATIONS

The subject application is a continuation of PCT international application PCT/CN2014/000549 filed on Jun. 3, 2014, which in turn claims priority on Chinese patent application No. CN 201310342084.2 filed on Aug. 7, 2013. The contents and subject matter of the PCT and Chinese priority applications are incorporated herein by reference.

FIELD OF TECHNOLOGY

The present invention relates to time and frequency transfer, and in particular, an encoding method and a decoding method for high-precision time transfer and an encoding device and a decoding device therefor.

BACKGROUND OF INVENTION

High precision remote time transfer technology finds valuable and important applications in the fields of satellite navigation, scientific research and measurement, aeronautics and astronautics, deep space exploration, telecommunication, power industry, and finance. With the improvement of atomic clock and increased demand for time synchronization precision in various applications, requirement for time transfer precision gets more demanding. In high precision time transfer, it is generally required to implement synchronous transfer of one pulse per second (1 PPS) signals, time message and control message by means of encoding. Encoding and decoding method is one of the main factors in deciding time transfer precision, which again depends on the transfer precision of the front-edge of pulse per second signals. Two-way satellite time and frequency transfer (TWSTFT) implements remote time transfer at sub-nanosecond level via pseudo-random spread spectrum coding. However, the scheme thereof requires complicated coding modulation and decoding of modulated codes, and is therefore costly. IRIG-B is an internationally adopted standard scheme for time transfer encoding. Its upsides include simple implementation, large volume of messages, standard interfaces, and low cost. However, TRIG-B transmits codes just at the speed of 100 bit/second and requires modulation onto high speed carrier for remote transmission. Moreover, as it carries no time interval message, additional communication channels are required to transmit time interval messages for two-way time comparison adopting the time code. Further, optical fiber has low consumption and high bandwidth, and its potential for implementing higher precision time transfer has attracted great attention. Nevertheless, design of prior art time codes is directed at space channels and electric cables. Improvement and optimization thereof based on features of optical fiber transmission systems is in need.

SUMMARY OF THE INVENTION

An object of the present invention is to provide an encoding device and a decoding device for high precision time transfer and an encoding method and a decoding method therefor, which is realized by modifying the standard IRIG-B time code to increase the transmission rate of its code elements, to add more message fields, and to generate a modified IRIG-B time code for remote transmission, with the benefit of carrying more synchronous time messages, so as to overcome defects of the prior art.

The technical solution of the present invention is as follows:

The present invention firstly provides a format for a modified IRIG-B time code. The standard IRIG-B time pulse width coding rule is preserved, while the width of code elements is compressed to raise transmission rate with the addition of more message fields. The specific format for the modified IRIG-B time code is as follows:

(1) The first 99 code elements of each frame are standard IRIG-B code fields for carrying standard IRIG-B time codes;

(2) Time interval field starts at the $100^{th}$ code element of each frame for carrying a time interval between the local time signal and the received time signal. The first code element of the field, that is, the $100^{th}$ code element of said each frame, denotes time-advance or time-delay, while the other code elements denote the measured time interval in unit of picoseconds;

(3) The field subsequent to the time interval field is a user-defined or padded field, for carrying user-defined time and/or control messages, while the unused portions are padded with '1' and/or '0' code elements;

(4) The last code element is the ending code element which is fixed to be a 'P' code element.

Directed at the format of the modified IRIG-B time code, the present invention provides an encoding device and a decoding device and manipulation methods therefor for realizing exact synchronization between the on-times of an output encoded time code and an input time signal (such as one pulse per second signal) and between the on-times of an output decoded time signal (such as pulse per second signal) and an input time code:

An encoding method for high precision time transfer comprises the following steps:

① a code generation module commencing counting at detecting a transmitted 1 PPS signal, obtaining the sequence of the current code element, selecting a corresponding code element for encoding based on the sequence number of the current code element, the current time message, and the time interval as measured locally, generating a non-synchronous modified TRIG-B time code, and transmitting the non-synchronous modified IRIG-B time code to a code synchronization module;

② at counting to the Nth code element at its electric low-level, the code generation module triggering a time synchronization enabling signal with a pulse width smaller than that of the 'P' code element, and outputting the time synchronization enabling signal to a synchronization signal generation module, where N being the last code element;

③ the synchronization signal generation module Anding the 1 PPS signal with the time synchronization enabling signal to generate a synchronization signal which synchronizes with a rise edge of a local 1 PPS signal and whose pulse width is smaller than that of the 'P' code element, and outputting the synchronization signal to a code synchronization module;

④ the code generation module Oring the non-synchronous modified IRIG-B time code with the synchronization signal, and outputting an IRIG-B time code which synchronizes with the local 1 PPS signal.

A decoding method for high precision time transfer, comprising the following steps:

① a reference marker identification module, at detecting a reference marker for timer message from a modified IRIG-B time code, that is, at detecting two consecutive reference code elements 'P', where the leading edge of the second 'P' code element being a 1 PPS timer reference, commencing counting, obtaining a sequence number of the current code element, restoring values of each code element subsequent to an identification bit of the reference marker based on the rule on pulse width coding, and transmitting said values to a metadata parser module;

② the reference marker identification module, at counting to the Nth code element at its electric low-level, generating a mask signal with a pulse width smaller than that of the 'P' code element, and transmitting the mask signal to a pulse per second parser;

③ the metadata parser module, based on the definition of the message field of the modified TRIG-B time code, outputting the time and control message, the time interval message, and the user-defined message;

④ the pulse per second parser module Anding the signal of the received modified IRIG-B time code with the mask signal, and outputting a 1 PPS signal synchronous with the on-time of the received modified IRIG-B time code.

An encoding device for implementing an encoding method for high-precision time transfer comprises a code generating module for receiving transmitted 1 PPS signals, a time message input from an external clock, a time interval message measured by a local time interval counter, and a user-defined message, said code generating module is connected respectively with a synchronization signal generating module and a code synchronization module, and further, said transmitted 1 PPS signals are admissible in the synchronization signal generating module to be Anded with a synchronization enabling signal generated by the code generating module, the result thereof being inputted into the code synchronization module to generate a modified IRIG-B time code.

A decoding device for implementing the decoding method for high-precision time transfer comprises a reference marker identification module for receiving a modified IRIG-B time code, said reference marker identification module is connected respectively with a metadata parser and a pulse per second parsing module, and further, the modified IRIG-B time code is admissible in the pulse per second parsing module to be Anded with a mask signal generated by the reference marker identification module to output a synchronous 1 PPS signal.

The present invention has the following advantages over prior art:

(1) The modified IRIG-B time code implements the same pulse width coding method as the standard IRIG-B time code, but with a smaller pulse width and a higher transmission rate. Moreover, each frame thereof is comprised of standard IRIG-B code fields, a time interval field, a reserved or padded field, and an ending code element, with the capability of carrying more messages. A single channel is employed for transmission of timing messages and testing messages (such as time interval and control messages) of two-way time comparison, and therefore system structure is simplified and real-time capability is enhanced.

(2) The time encoding and decoding method and the device therefor realize exact synchronization between the on-time of an output encoded time code and that of a transmitted time signal (such as pulse per second signal) and between the on-time an output decoded time signal and that of an input time code. Fluctuation due to encoding and decoding manipulation and its correlation with working frequencies are reduced, and time transfer accuracy is increased.

(3) No spread spectrum or carrier is needed and hence implementation is comparatively simple by directly employing commercial optical fiber communication equipment and systems for realizing high-precision time transfer.

DETAILED DESCRIPTIONS OF THE EMBODIMENTS

In combination with drawings and an embodiment hereunder provided, the present invention will be further expounded. The embodiment is based on the technical solution of the present invention and provides detailed implementations and procedures thereof, which are not meant to limit the scope of the present invention.

Figure 1:
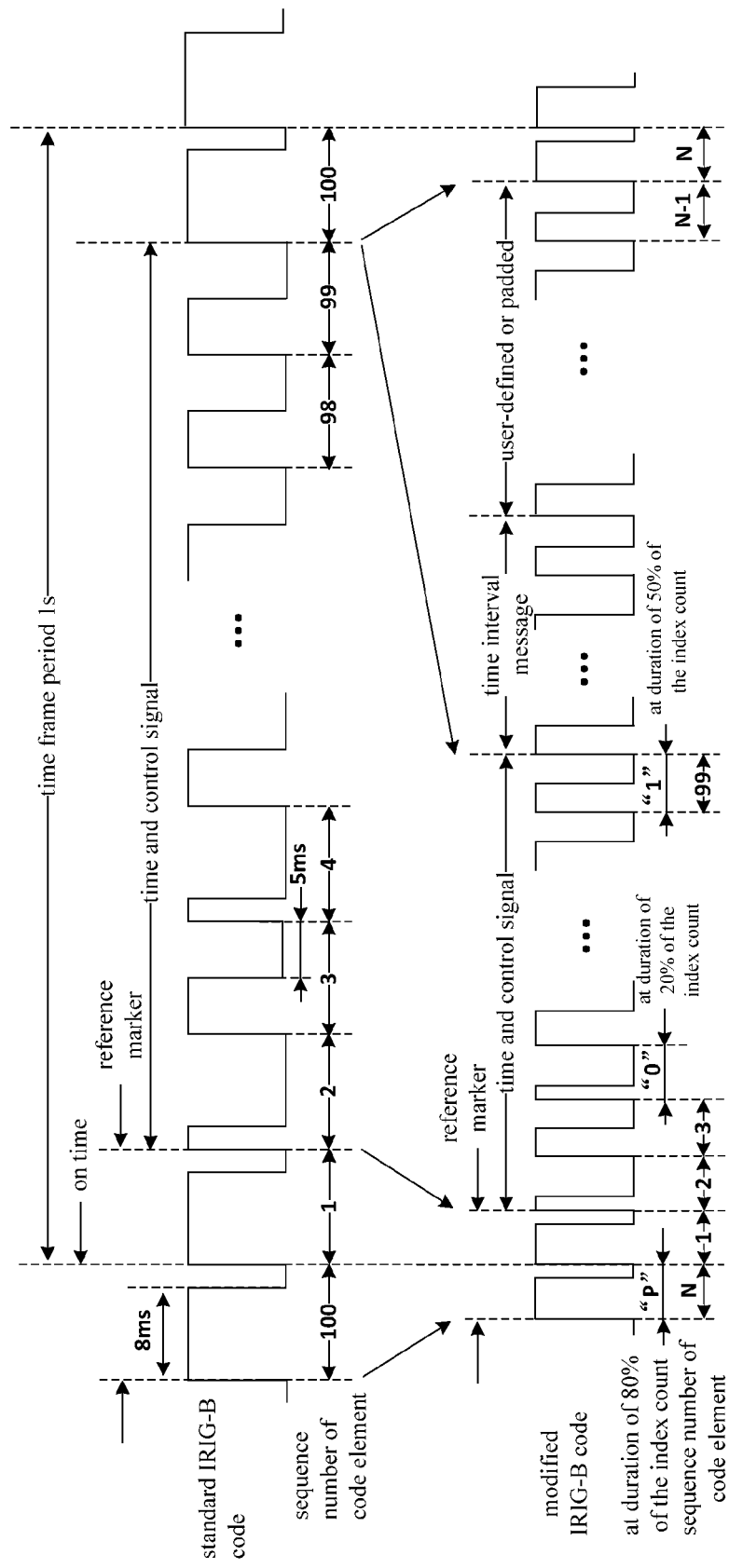
FIG. 1 is a diagram showing the comparison of the format of the standard IRIG-B time code with that of the modified IRIG-B time code.

FIG. 1 compares the format of the standard TRIG-B time code with that of the modified TRIG-B time code. As is shown therein, the modified IRIG-B time code comprises three code elements for pulse width encoding, respectively '0' code element at duration of 20% of the index count, '1' code element at duration of 50% of the index count, and 'P' code element at duration of 80% of the index count. Code element rate is N bits/s, that is, one second frame contains N code elements. The modified IRIG-B time code has the same definitions for the first 99 code elements and the last code element in a frame as the standard TRIG-B time code, where the first 99 code elements are standard IRIG-B fields, for carrying the same message as that for the first 99 code elements of the standard IRIG-B code elements. The last code element is the ending code element, and is fixed as the 'P' code element. The field subsequent to the $99^{th}$ code element is the time interval field, for carrying a time interval between a local time signal and a received time signal. The first code element of the time interval field (that is, the $100^{th}$ code element of each frame) denotes an advance or a delay, while the other code elements denote a time interval measure value in unit of picoseconds. The field subsequent to the time interval field is a reserved or padded field, for carrying user-defined time and/or control messages, with the unused bits being filled up with '1' and/or '0' code elements. For the sake of convenience, and without loss of generality, referring to FIG. 1, sequence number for code elements is presumed to start at 1, and the number of the code elements in a time interval field is m (m<(N−100)). Definition for the information carried by the modified IRIG-B code is as follows: code elements with sequence numbers of 1-99 are defined in the same manner as for those in the standard IRIG-B; code elements with sequence numbers from 100 to 99+m denote a time interval message (where the $100^{th}$ code element denotes advance or delay, for example, '0' denotes delay, '1' denotes advance; the m−1 code elements with sequence numbers from 101 to (99+m) denote a time interval measure value in unit of picoseconds); code elements with sequence numbers from 100+m to (N−1) carry a user-defined message and filled-up code elements (in the embodiment, the '1' code element is utilized for the filled-up code element); the Nth code element is defined in the same manner as for that of the 100$^{th}$ code element in the standard IRIG-B. Assume code element rate as 1 Mb/s, and the number of code elements in the time interval as 40. Each frame thus has 1000000 code elements, with the 3 categories of code elements being: the '0' code element has a pulse width of 200 ns; the '1' code element has a pulse width of 500 ns; and the 'P' code element has a pulse width of 800 ns. The code element with sequence number 1 is a 'P' code element, the front edge thereof denotes the on-time of a 1 PPS. Code elements with sequence numbers from 2 to 99 carry a time and control message defined in the same manner as for those in the standard IRIG-B; code elements with sequence numbers 100-139 denote a time interval message; code elements with sequence numbers 140-999999 carry a user-defined message and filled-up code elements; the 1000000$^{th}$ code element is the 'P' code element.

Figure 2:
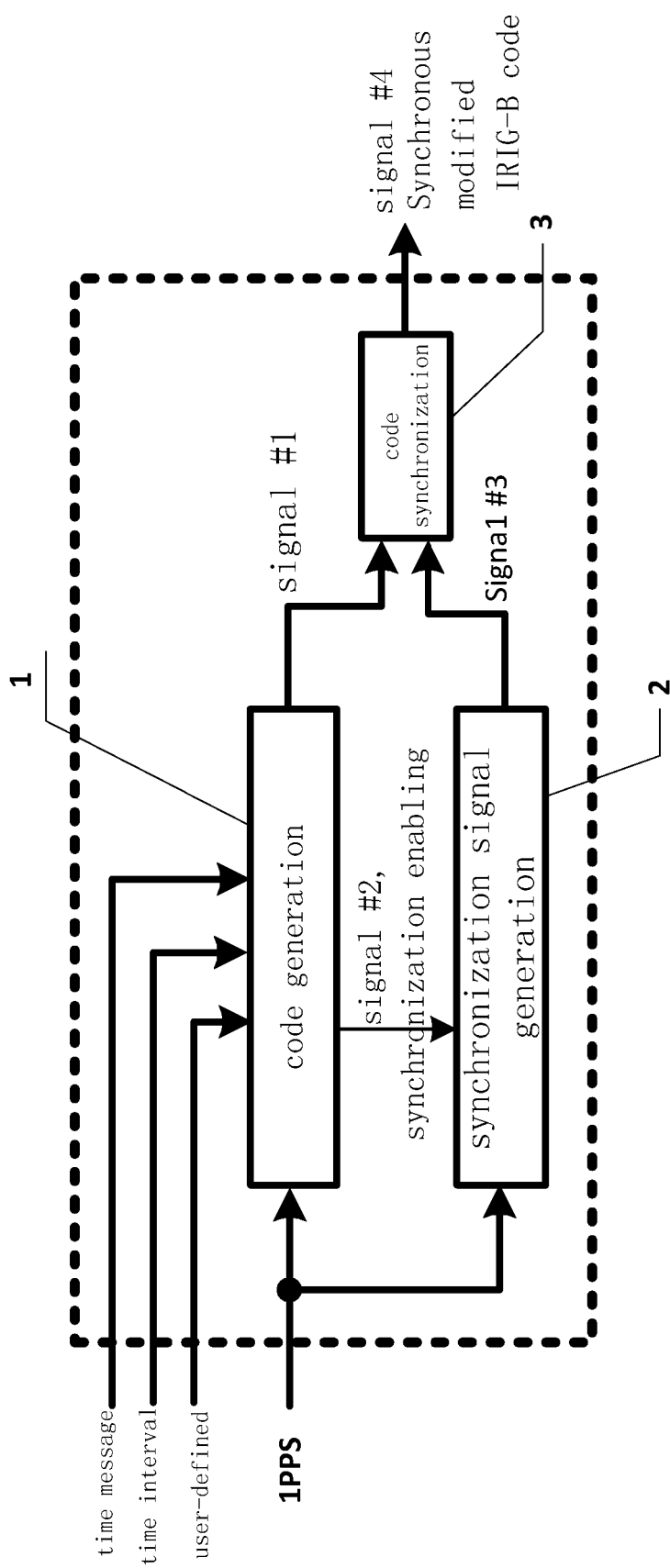
FIG. 2 is a schematic diagram of the high-precision time transfer encoding device of the present invention.
Figure 3:
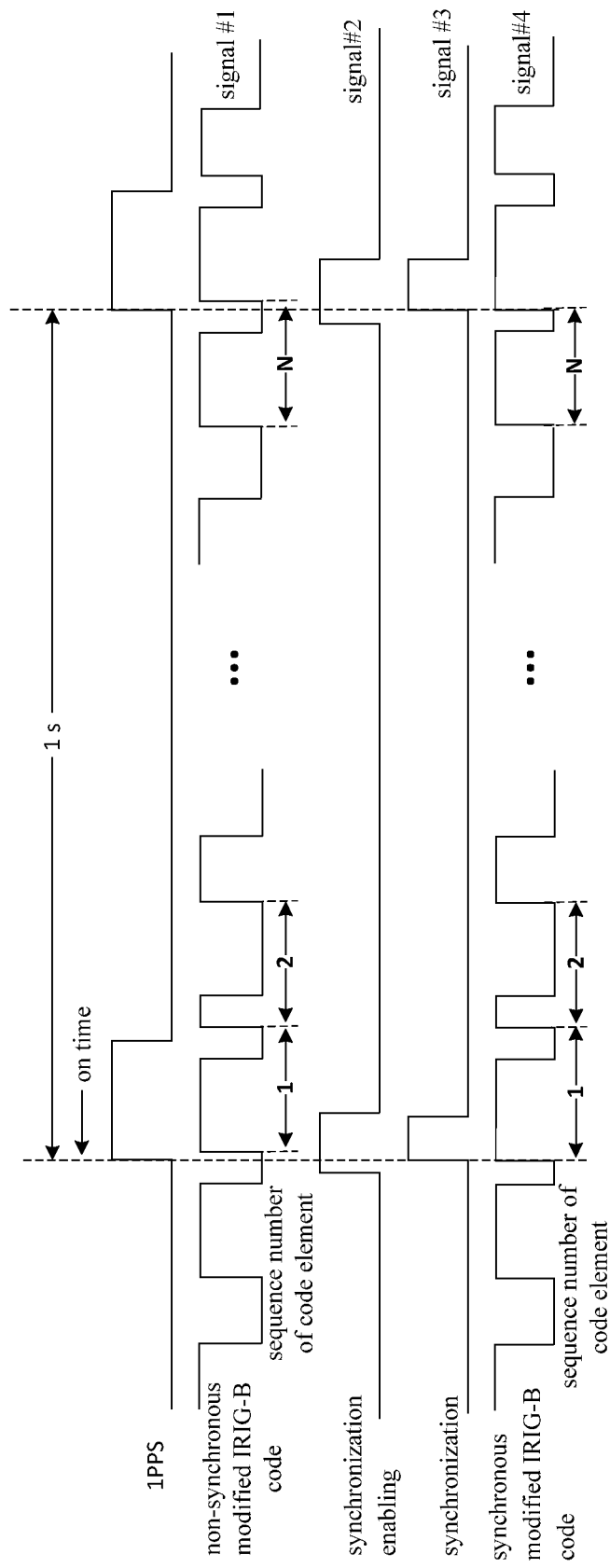
FIG. 3 is a schematic diagram of the encoding method for high-precision time transfer of the present invention.

FIG. 2 is a schematic diagram of the encoding device for high-precision time transfer of the present invention. FIG. 3 is a schematic diagram of the encoding method for high-precision time transfer of the present invention. The encoding device comprises a code generation module 1, a synchronous signal generation module 2, and a code synchronization module 3. The encoding process is as follows: the code generation module 1, at detecting a transmitted 1 PPS signal, commences counting, obtains the sequence number of the current code element, and selects, based on the sequence number of the code element, a current time message, and a time interval message measured locally, a corresponding code element (the '0' code element, '1' code element, and 'P' code element) for encoding, and outputs a corresponding signal #1 (non-synchronous time code) to the code synchronization module 3. The code generation module 1, at counting to the Nth code element (that is, the last code element) at its electric low-level, triggers a signal #2 (time synchronization enabling) (is denoted with an electric high-level, as shown in FIG. 3), and outputs the signal #2 to the synchronous signal generation module 2. The synchronous signal generation module 2, via Anding 'time synchronization enabling' signal #2 with the 1 PPS signal to be transmitted, generates the signal #3, which is synchronous with the 1 PPS signal, and outputs the signal #3 to the code synchronization module 3. In the code synchronization module 3, the signal #1 (a non-synchronous modified IRIG-B time code) is Ored with the signal #3 (a synchronization signal) to output the signal #4 (an IRIG-B time code synchronous with the local 1 PPS signal).

Figure 4:
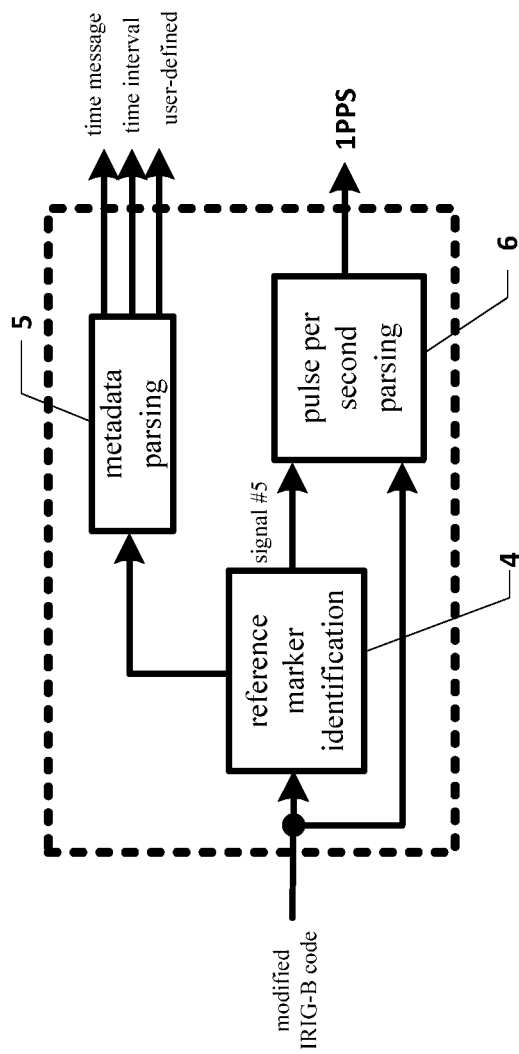
FIG. 4 is a schematic diagram of the structure of the decoding device for high-precision time transfer of the present invention.
Figure 5:
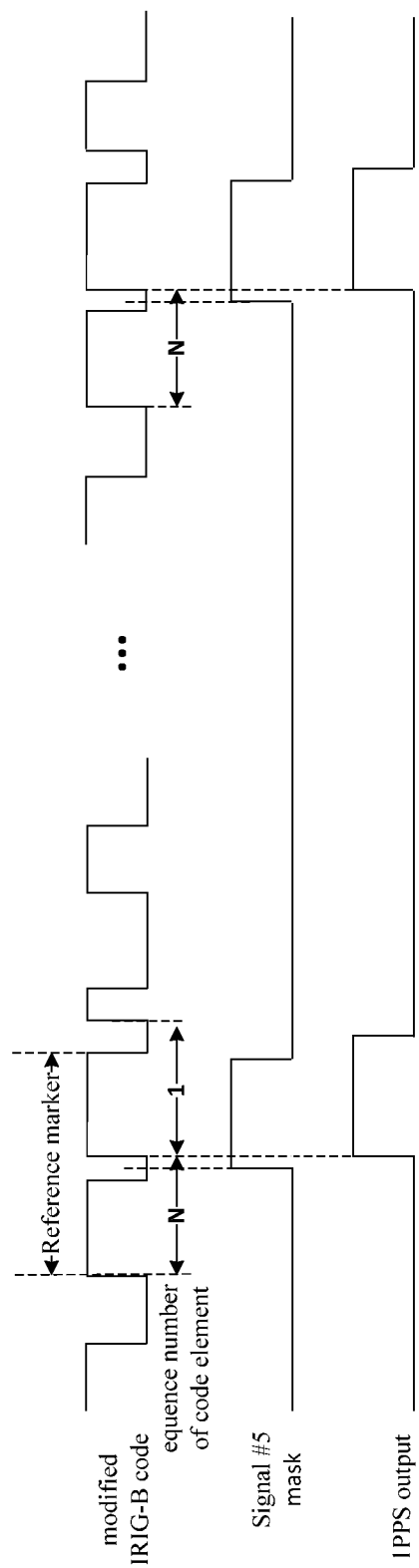
FIG. 5 is a schematic diagram of the decoding method for high-precision time transfer of the present invention.

FIG. 4 is a schematic diagram of the structure of the decoding device for high-precision time transfer of the present invention. FIG. 5 is a schematic diagram of the decoding method for high-precision time transfer of the present invention. Referring to the Figures, the decoding device comprises a reference marker identification module 4, a metadata parser module 5, and a pulse per second parser module 6. The decoding process is as follows: the reference marker identification module 4, at detecting a reference marker for timer message (two consecutive reference code elements 'P', where the rising edge of the second 'P' code element is a 1 PPS timer reference) from a received modified IRIG-B code, obtains the sequence number of the code element via counting, and restores values for each code element subsequent to the identification bit of the reference marker based on the pulse width coding rule (the '0' code element is at duration of 20% of the index count, and the '1' code element at duration of 50% of the index count), and outputs said values to the metadata parser module 5; at counting to the Nth code element (the 'P' code element) of the modified time code at its electric low-level, generates a signal #5 ('mask signal') with a pulse width smaller than that of the 'P' code element, and outputs the signal #5 to the pulse per second parser module 6. The metadata parser module 5 parses out a time message (second, minute, hour, and days), a control message, a time interval message, and a user-defined message according to definitions of message fields of the modified IRIG-B time code. The pulse per second parser module 6 outputs a 1 PPS signal synchronous with the on-time of the modified IRIG-B time code via Anding the mask signal #5 with the received modified IRIG-B time code.

We claim:

1. A method for encoding a modified IRIG-B time code for high-precision time transfer, comprising generating modified IRIG-B time code frames in an encoding device, each of the frames comprising N number of code elements, N denoting an integer larger than 100, at a code element rate of N bits per second, having fields of a standard TRIG-B time code, a time interval field, a user-defined or padded field, and an ending code element;

defining, by the encoding device, three code element values for the frames, wherein the three code element values have pulse width encoding and include a '0' code element at duration of 20% of an index count, a '1' code element at duration of 50% of the index count, and a 'P' code element at duration of 80% of the index count;

preserving definitions of the first 99 code elements and the last code element in the standard IRIG-B time pulse width encoding rule in each of the frames, and then compressing width of the code elements of the standard IRIG-B by the encoding device;

adding message fields between the 100th code element and (N−1)th code element by the encoding device, the added message fields including:

the time interval field which starts at the 100$^{th}$ code element of each of the frames for carrying a time interval between a local time signal and a received time signal, the first code element of the time interval is the 100$^{th}$ code element of each of the frames and denotes an advance or a delay, with remaining code elements of the time interval denotes a time interval measure value in unit of picoseconds;

the user-defined or padded field which is subsequent to the time interval field for carrying user-defined time, control messages, or both, with the code element values '1', '0', or both, filling up a bit of an un-used code element; and the ending code element is the last code element of each of the frames and is fixed as a 'P' code element; and transmitting the modified IRIG-B time code frames from the encoding device via space channels, electric cables, or optical fiber.

2. The method for high-precision time transfer using the modified IRIG-B time code frame according to claim 1, further comprising commencing counting when a code generation hardware module, within the encoding device, detects a transmitted 1PPS signal, said 1PPS signal being transmitted by space channels, electric cables, or optical fiber from a reference clock, obtaining a sequence number of a current code element, selecting a corresponding code element for encoding based on the sequence number of the current code element, a current time message, and a time interval message as measured locally, generating a non-synchronous modified IRIG-B time code frame, and transmitting the non-synchronous modified IRIG-B time code frame to a code synchronization module through an electric path;

triggering a time synchronization enabling signal with a pulse width smaller than that of the 'P' code element when the code generation module counts to the Nth code element at its electric low-level, and transmitting said time synchronization enabling signal to a synchronization signal generation module through an electric path, where N is for a last code element;

generating a synchronization signal synchronous with a rising edge of the transmitted 1PPS signal and with a pulse width smaller than that of the 'P' code element when the synchronization signal generation module And the transmitted 1PPS signal received from the reference clock with the time synchronization enabling signal, and transmitting said synchronization signal to a code synchronization module through an electric path; and Oring the non-synchronous modified IRIG-B time code frame with the synchronization signal by the code synchronization module, and outputting a modified IRIG-B time code frame synchronous with the local 1PPS signal through an electric interface.

3. A decoding method for high-precision time transfer using a modified IRIG-B time code, comprising receiving, by a decoding device, at least one modified IRIG-B time code frame, the modified IRIG-B time code frame being generated and transmitted according to claim 1;

commencing counting, by the decoding device, when a reference marker identification module detects a reference marker for timer message from the received modified IRIG-B time code frame, that is, detecting two consecutive reference code elements 'P', where a rising edge of a second 'P' code element is a 1PPS reference, obtaining a sequence number of a current code element, restoring a value of each code element subsequent to an identification bit of the reference marker based on a pulse width coding rule, and transmitting said value to a metadata parser module;

generating, by the decoding device, a mask signal with the pulse width smaller than that of the 'P' code element when the reference marker identification module counts to an Nth code element at its electric low-level, and outputting the mask signal to a pulse per second parser module;

outputting a time and control message, a time interval message, and a user-defined message based on a definition in a field of the modified IRIG-B time code frame by the metadata parser hardware module within the decoding device; and Anding a signal of the received modified IRIG-B time code frame with the mask signal by the pulse per second parser module, and outputting a 1PPS signal synchronous with an on-time of the received modified IRIG-B time code frame by the decoding device, wherein the signal of the modified IRIG-B time code frame is sent by space channels, electric cables, or optic fiber.

4. An encoding device, comprising
a code generation hardware module being configured to:

detect a 1PPS signal transmitted by space channels, electric cable, or optical fiber from a reference clock, commence counting, obtain a sequence number of a current code element, select a code element for encoding based on the sequence number of the code element, a current time message, and a time interval message measured locally, and output a first signal for code synchronization, and trigger a second signal and output the second signal for synchronous signal generation upon counting a Nth code element, a synchronization signal generation hardware module connected to the code generation module, the synchronization signal generation module being configured to:

receive the second signal from the code generation module and the 1PPS signal,

Anding the second signal with the 1PPS signal to be transmitted, generate a third signal that is synchronous with the 1PPS signal, and output the third signal for code synchronization, and a code synchronization hardware module connected to the code generation module and to the synchronization signal generation module, respectively, the code synchronization module being configured to:

receive the first signal from the code generation module and to the third signal from the synchronization signal generation module, and Oring the first signal with the third signal to output a fourth signal that is an IRIG-B time code frame synchronous with the 1PPS signal, wherein the transmitted 1PPS signal, the time message, the time interval message, and the user-defined message are admitted in the code generation module; the code generation module is respectively connected with the synchronization signal generation module and the code synchronization module;

the transmitted 1PPS signal is admitted and Anded in the synchronization signal generation module with the second signal of a synchronization enabling signal generated in the code generation module to have the third signal as a result signal; and the result signal is admitted and outputted by the code synchronization module to be the fourth signal of a synchronous modified IRIG-B time code frame.

5. A decoding device, comprising
a reference marker identification hardware module being configured to:

receive a modified IRIG-B time code frame, detect a reference marker for timer message in the modified IRIG-B time code frame, the timer message being two consecutive reference code elements 'P' and a rising edge of the second 'P' code element is a 1PPS timer reference, obtain a sequence number of the code element via counting, restore values for each code element subsequent to an identification bit of the reference marker based on a pulse width coding rule, and output the values for metadata parsing, and generate a fifth signal with a pulse width smaller than the pulse width of a 'P' code element upon counting to a Nth code element of the modified IRIG-B time code frame and output the fifth signal for pulse per second parsing, a metadata parser hardware module connected to the reference marker identification module, the metadata parser module being configured to:

receive the values for metadata parsing from the reference marker identification module, parse out a time message, a control message, a time interval message, and a user-defined message according to definitions of message fields of the modified IRIG-B time code frame, and a pulse per second parser hardware module connected to the reference marker identification module, the pulse per second parser module being configured to receive the modified IRIG-B time code frame and the fifth signal from the reference marker identification module, output a 1PPS signal synchronous with an on-time of the modified IRIG-B time code frame via Anding the fifth signal with the received modified IRIG-B time code frame, wherein the modified IRIG-B time code frame is admitted in the reference marker identification module; the reference marker identification module is respectively connected with the metadata parser module and the pulse per second parser module;

the pulse width coding rule is to denote a '0' code element at a duration of 20% of an index count, a '1' code element at a duration of 50% of the index count, and the Nth code element is the 'P' code element;

the modified IRIG-B time code frame is admitted and Anded in the pulse per second parser module with the mask signal generated by the reference marker identification module to output a synchronous 1PPS signal for transmission by space channels, electric cables, or optical fiber.

* * * * *